(12) United States Patent
Zimlich

(10) Patent No.: US 6,972,587 B2
(45) Date of Patent: Dec. 6, 2005

(54) BUILT-IN SELF REPAIR FOR AN INTEGRATED CIRCUIT

(75) Inventor: David A. Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 441 days.

(21) Appl. No.: 10/025,395

(22) Filed: Dec. 19, 2001

(65) Prior Publication Data
US 2003/0112029 A1 Jun. 19, 2003

(51) Int. Cl.⁷ .............................. H03K 19/173
(52) U.S. Cl. .................. 326/10; 326/38; 327/525
(58) Field of Search ........................... 326/37–41, 9, 326/10; 327/525

(56) References Cited

U.S. PATENT DOCUMENTS 5,790,448 A * 8/1998 Merritt et al. ............... 365/96
6,094,385 A * 7/2000 Trimberger ................. 365/200
6,327,178 B1 * 12/2001 Blodgett .................... 365/177
6,351,140 B2 * 2/2002 Cutter et al. ............... 326/38
6,366,118 B2 * 4/2002 Oh et al. .................... 326/38

OTHER PUBLICATIONS

Arcioni et al., "Designand Characterization of SiIntegrated Inductors," May 1998.

* cited by examiner

Primary Examiner—Don Le
(74) Attorney, Agent, or Firm—Fletcher Yoder

(57) ABSTRACT

An integrated circuit, such as a memory device, includes a built-in repair circuit. The repair circuit includes an on-chip source that produces a programming signal of sufficient duration and magnitude to program a programmable element that normally isolates a secondary circuit, such as redundant circuitry, from the remainder of the circuits on the device. Once programmed, the redundant circuitry may take the place of failed circuitry, and thus repair the device.

66 Claims, 4 Drawing Sheets

BUILT-IN SELF REPAIR FOR AN INTEGRATED CIRCUIT

BACKGROUND OF THE INVENTION

1. Field of the Invention

The present invention relates generally to integrated circuits and, more particularly, to an integrated circuit having a self repair circuit thereon.

2. Description of the Related Art

This section is intended to introduce the reader to various aspects of art that may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device coupled to the microprocessor. Not only does the microprocessor access a memory device to retrieve the program instructions, it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. For instance, volatile memories, such as dynamic random access memories (DRAMs), must be continually powered in order to retain their contents, but they tend to provide greater storage capability and programming options and cycles than non-volatile memories, such as read only memories (ROMs). Non-volatile memories, on the other hand, traditionally permit only limited reprogramming, so they are often used to store operating programs and the like. For example, certain memories, such as electrically erasable programmable read only memories (EEPROMs) and Flash memories, permit limited reprogramming. However, such memories typically must be tied to a relatively high external voltage, e.g., 12 volts, and/or to a dedicated programming device to facilitate such reprogramming.

Contemporary semiconductor-based memory products use one or more arrays of memory cells, often referred to as a memory matrix. Such arrays are formed from a plurality of rows and columns of memory cells. Memory devices of this type often incorporated a high degree of redundancy in order to improve manufacturing yields. Present redundancy techniques in memory products include providing extra memory array columns and/or extra memory array rows that can be used to replace defective columns and/or rows. These redundant rows and columns are typically isolated from the memory matrix by antifuses. While a fuse is a low resistance line that passes current until the amperage on the line becomes high enough to "blow" the fuse to create an open circuit, an antifuse is normally an open circuit until the voltage across the antifuse becomes high enough to "blow" the antifuse to create a closed circuit. The normally open circuit created by the antifuse effectively isolates redundant rows and columns from the memory matrix unless they are needed. If a redundant row or column is needed, the antifuse isolating the selected redundant row or column is blown to create a closed circuit to add the redundant row or column to the memory matrix.

During initial testing of a memory circuit, which typically takes place before the memory circuit is even packaged, an external testing apparatus may exercise the memory circuit to determine whether all of the rows and columns of the memory matrix are functioning properly. If so, then the redundant rows and columns are not used. If not, however, the external testing apparatus may apply a high voltage to the antifuse of the selected redundant row or column to replace a nonfunctioning row or column and, thus, repair the memory matrix. The voltage used to blow the antifuse is typically above the power supply voltage ($V_{cc}$) of the memory circuit.

While external testing devices typically perform such testing and repair functions admirably, they are not without their drawbacks. First, the memory circuit to be tested must be coupled to the external testing apparatus, and the memory circuit must remain in the external testing apparatus until it is fully tested and fully repaired. This can be a time-consuming process even if only memory device is tested at a time. However, if the external testing apparatus is capable of testing multiple memory chips at a time, then all of the chips must remain in the testing apparatus until the last one is fully tested and fully repaired. Secondly, the external testing apparatus is somewhat limited in the speed at which it can conduct tests due to the long signal pathways that necessarily extend between the external testing apparatus and the integrated circuit under test.

In an effort to increase testing speed, integrated circuits may incorporate a built-in self test circuit. Built-in self test circuits can test multiple memory matrices at maximum clock speed. Indeed, built-in self test circuits can perform a full functionality test of a memory matrix and determine the most efficient repair. Typically, a built-in self test circuit sends a signal to an external testing apparatus so that the external testing apparatus can blow the antifuse or instruct a laser to blow an antifuse.

As is clear from the above discussion, although a built-in self test circuit can enhance the speed at which an integrated circuit is tested, it cannot perform the actual repair. Therefore, the one item that keeps the integrated circuit coupled to the external testing apparatus is the actual repair portion of the testing. Currently, the voltage and current required to blow an antifuse cannot be generated on the integrated circuit itself.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Specific embodiments of processor-based systems, integrated circuits, memory device, and methods of testing and repairing such circuits are described below as they might be implemented for use in integrated circuits, such as semiconductor memory circuits. In the interest of clarity, not all features of an actual implementation are described in this specification. It should be appreciated that in the development of any such actual implementation, as in any engineering project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking for those of ordinary skill having the benefit of this disclosure.

Figure 1:
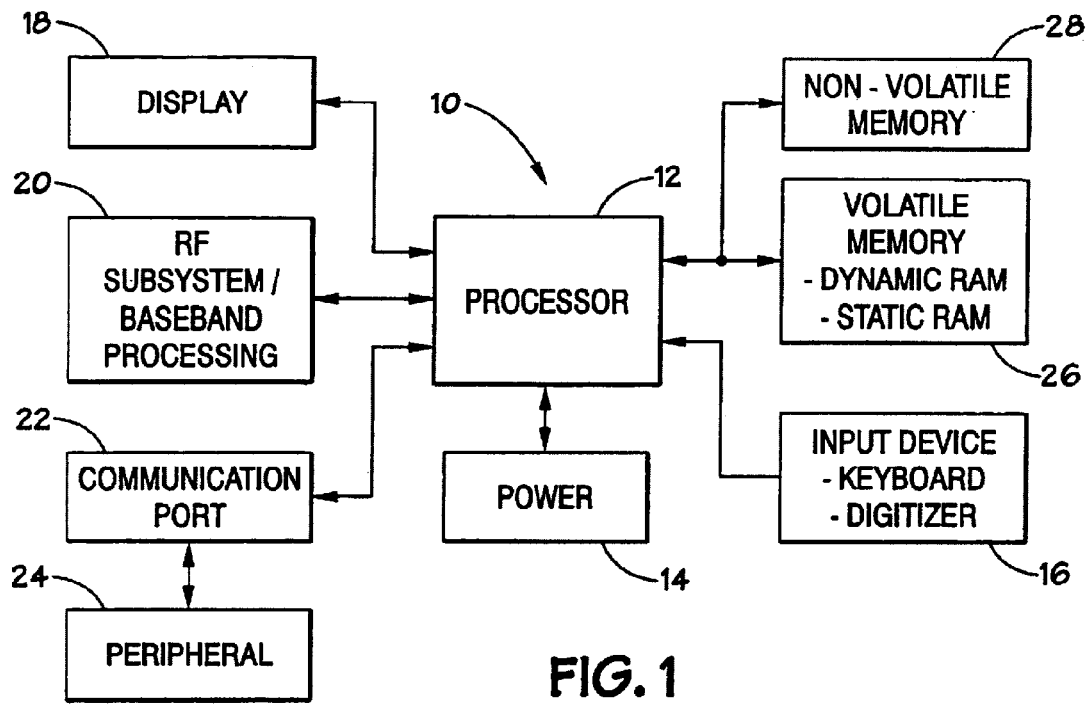
FIG. 1 illustrates a processor-based system that may incorporate one or more integrated circuits having a built-in self repair capability in accordance with the present invention.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, one or more processors 12, such as a microprocessor(s), control many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor(s) 12, depending upon the functions that the device 10 performs. For instance, a user interface 16 may be coupled to the processor(s) 12. The user interface 16 may include an input device, such as buttons, switches, a keyboard, a light pin, a mouse, and/or a voice recognition system, for instance. A display 18 may also be coupled to the processor (s) 12. The display 18 may include an LCD display, a CRT, LEDs, and/or an audio display. Furthermore, an RF subsystem/baseband processor 20 may also be coupled to the processor(s) 12. The RF subsystem/baseband processor 20 may include an antenna that is coupled to an RF receiver and to an RF transmitter (not shown). A communication port 22 may also be coupled to the processor(s) 12. The communication port 22 may be adapted to be coupled to a peripheral device 24, such as a modem, a printer, or a computer, for instance, or to a network, such as a local area network or the Internet.

Because the processor(s) 12 controls the functioning of the device 10 generally under the control of software programming, memory is coupled to the processor(s) 12 to store and facilitate execution of the software program. For instance, the processor(s) 12 may be coupled to volatile memory 26, which may include dynamic random access memory (DRAM), static random access memory (SRAM), Double Data Rate (DDR) memory, etc. The processor(s) 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

Figure 2:
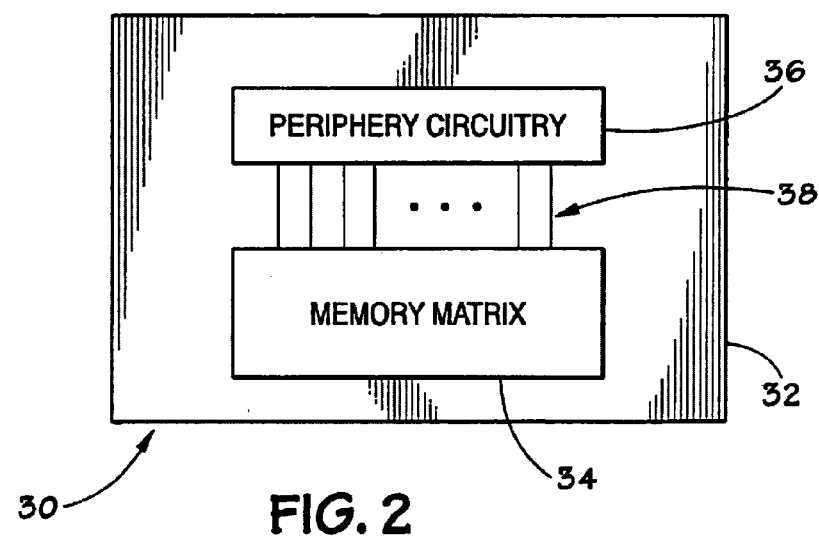
FIG. 2 illustrates a block diagram of a memory circuit incorporating a built-in self repair capability in accordance with the present invention.

An exemplary integrated circuit, such as a memory device, is illustrated in FIG. 2 and generally designated by a reference numeral 30. The memory device 30 is an integrated circuit memory that is advantageously formed on a semiconductor substrate 32. The memory device 30 includes a memory matrix or array 34 that includes a plurality of memory cells for storing data, as described below. The memory matrix 34 is coupled to periphery circuitry 36 by the plurality of control lines 38. The periphery circuitry 36 may include circuitry for addressing the memory cells contained within the memory matrix 34, along with circuitry for storing data in and retrieving data from the memory cells. The periphery circuitry 36 may also include other circuitry used for controlling or otherwise insuring the proper functioning of the memory device 30, such as test and/or repair circuits.

Figure 3:
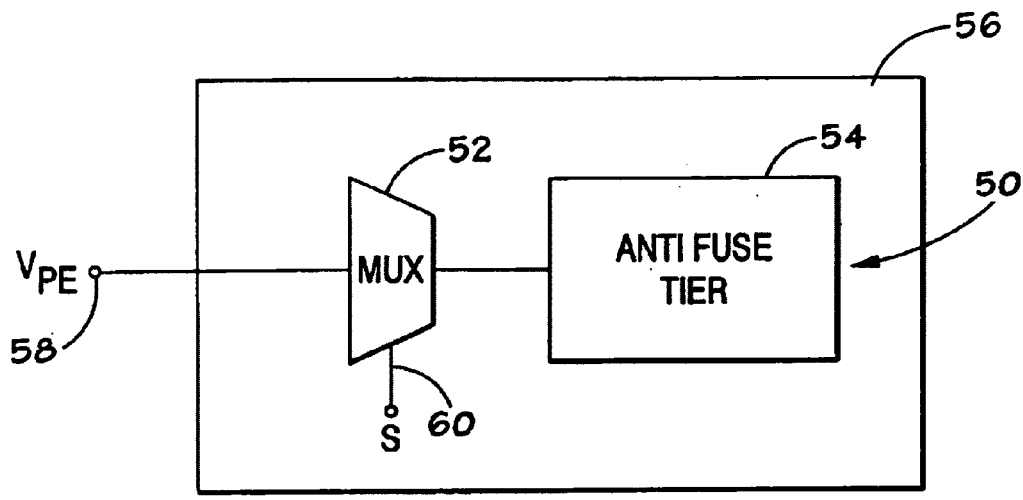
FIG. 3 illustrates an integrated circuit having a conventional repair capability.

As mentioned previously, an integrated circuit that includes programmable elements, such as antifuses, has typically required an external programming voltage $V_{pe}$ to program the programmable elements. An example of such a repair circuit is illustrated in FIG. 3. The repair circuit 50 includes a multiplexer 52 that is coupled to a plurality of programmable elements, such as a tier of antifuses 54. The multiplexer 52 and the antifuses 54 are located on the integrated circuit 56. However, the programming voltage $V_{pe}$ is externally applied via an I/O pin 58. In operation, the external programming voltage $V_{pe}$ is selectively coupled to one of the plurality of programmable antifuses 54 by virtue of entering the appropriate input on the select line 60 of the multiplexer 52. Although the repair circuit 50 is capable of successfully programming the antifuses 54 and, thus, repairing the integrated circuit 56, the disadvantages of utilizing an external programming voltage $V_{pe}$ have already been discussed.

Figure 4:
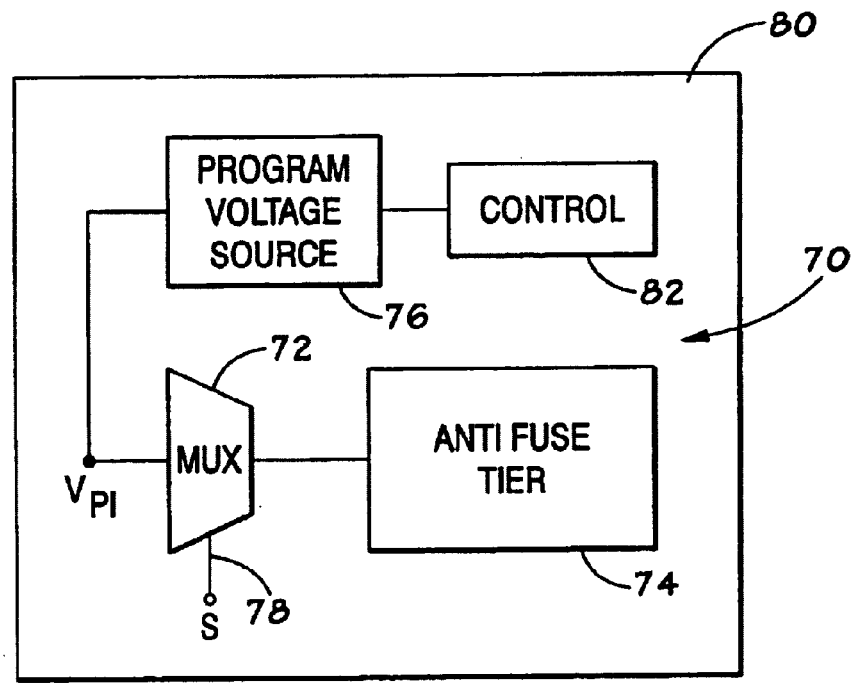
FIG. 4 illustrates an integrated circuit, such as a memory circuit, having a built-in self repair capability in accordance with the present invention.

To address these concerns, a built-in self repair circuit may be utilized. As illustrated by way of example in FIG. 4, a built-in self repair circuit 70 may also include an on-chip switch or multiplexer 72 coupled to a plurality of programmable elements, such as a tier of antifuses 74. However, instead of using an external programming voltage, the built-in self repair circuit 70 further includes an internal or on-chip programming voltage source 76. The programming voltage source 76 outputs an internal programming voltage $V_{pi}$ that is delivered to the multiplexer 72. A selected one of the plurality of antifuses 74 is coupled to the internal programming voltage $V_{pi}$ by virtue of entering the proper input on the select line 78 of the multiplexer 72. Thus, unlike the integrated circuit 56, the integrated circuit 80 contains elements capable of programming the antifuses 74 to repair the integrated circuit 80 without using an external voltage source for providing the programming voltage.

The integrated circuit 80 may also include a control circuit 82 that is coupled to the programming voltage source 76. The control circuit 82 may include, for example, a built-in self test circuit that operates in a conventional manner to test all or a portion of the integrated circuit 80 to ensure that it is functioning properly. If not, the control circuit 82 may select the appropriate antifuse 74 and trigger the programming voltage source 76 to blow the selected antifuse. The control circuit 82 may also receive signals from an external testing apparatus regarding a failed component on the integrated circuit 80, so that the control circuit 82 can select the appropriate antifuse 74 and trigger the programming voltage source 76 to blow the selected antifuse. Furthermore, the control circuit 82 can interface with a final system in which the integrated circuit 80 is incorporated, such as the system 10 illustrated in FIG. 1. For example, if the integrated circuit 80 is a memory circuit and the processor 12 determines that a memory location has become nonfunctional, the processor 12 can signal the control circuit 82 to repair the integrated circuit 80 by selecting the appropriate antifuse 74 and triggering the programming voltage source 76 to repair the integrated circuit 80. Once the integrated circuit 80 has been repaired, the processor 12 can again attempt to store information in the previously nonfunctional memory location to ensure that the location has been repaired.

Figure 5:
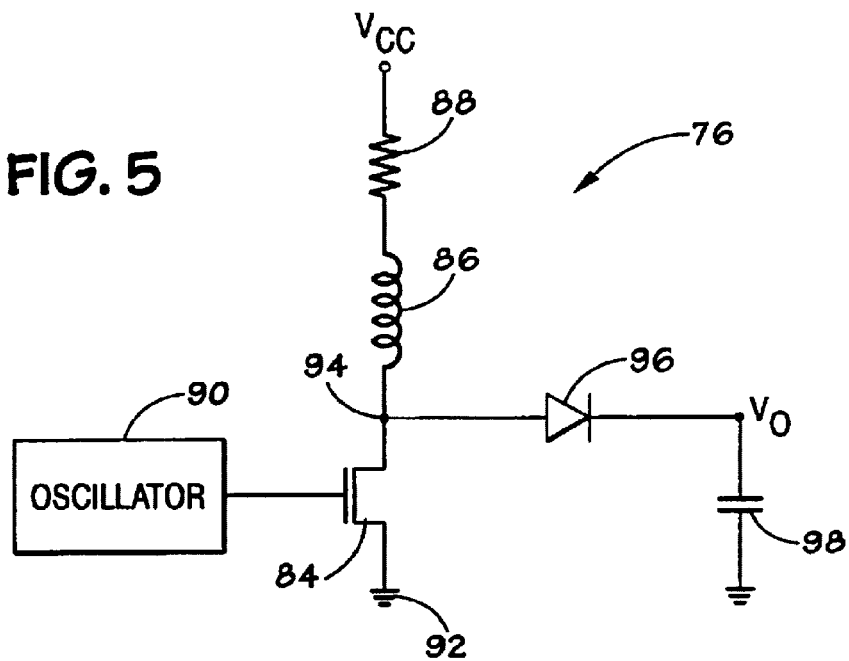
FIG. 5 illustrates a flyback pump in accordance with the present invention.

One example of a suitable programming voltage source 76 is illustrated schematically in FIG. 5. In this example, the programming voltage source 76 is a flyback pump that is capable of generating relatively high voltage outputs from a relatively low voltage source. The flyback pump operates by switching on a transistor, such as an N-channel MOSFET 84, to sink current through an inductor 86. One terminal of the inductor 86 is coupled to the drain of the MOSFET 84, while the other terminal of the inductor 86 is coupled to a supply voltage $V_{cc}$ through a resistor 88. The MOSFET 84 may be switched on and off in any suitable fashion, but in this example an oscillator 90, such as voltage controlled oscillator, is operatively coupled to the gate of the MOSFET 84. Two inverters may be coupled in series between the oscillator 90 and the gate of the MOSFET 84 to convert the output of the oscillator to a square wave so that the MOSFET 84 switches quickly to improve the efficiency and energy storing capability of the inductor 86.

When the MOSFET 84 is switched on by the oscillator 90, current flows from the voltage source $V_{cc}$ through the resistor 88, the inductor 86, and the MOSFET 84 to circuit ground 92. During this stage, the inductor 86 stores energy in accordance with the equation $\frac{1}{2} LI^2$, where L is the inductance of the inductor 86 and where I is the magnitude of the current flowing through the inductor 86. When the MOSFET 84 is switched off by the oscillator 90, the inductor 86 will try to maintain this current level. However, as the magnetic field in the inductor 86 collapses, the voltage will increase at the node 94 between the inductor 86 and drain of the MOSFET 84. This voltage is sensed and captured using a diode 96 as a peak detector. The peak voltage is delivered at the cathode of the diode 96 as an output voltage $V_o$.

Figure 6:
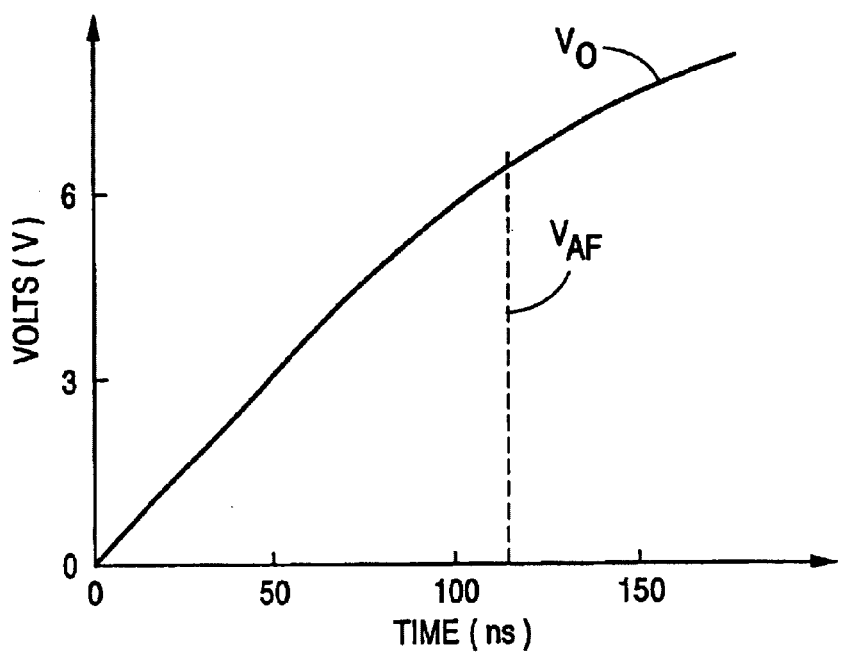
FIG. 6 illustrates a graph depicting an example of an output voltage generated by the flyback pump of FIG. 5 and depicting corresponding voltage across an associated antifuse.

The output voltage $V_o$ is delivered to a programmable element, such as an antifuse 98. As illustrated in FIG. 6, the inductor 86 will continue to deliver the voltage $V_o$ until the antifuse 98 is blown. By way of example, the output voltage $V_o$ rises relatively steadily from 0 volts to approximately 6.2 volts in approximately 120 nanoseconds. At this point, the output voltage $V_o$ is sufficient to blow the antifuse 98, hence the antifuse voltage $V_{af}$ drops off sharply at this point and returns to 0 volts.

Figure 7:
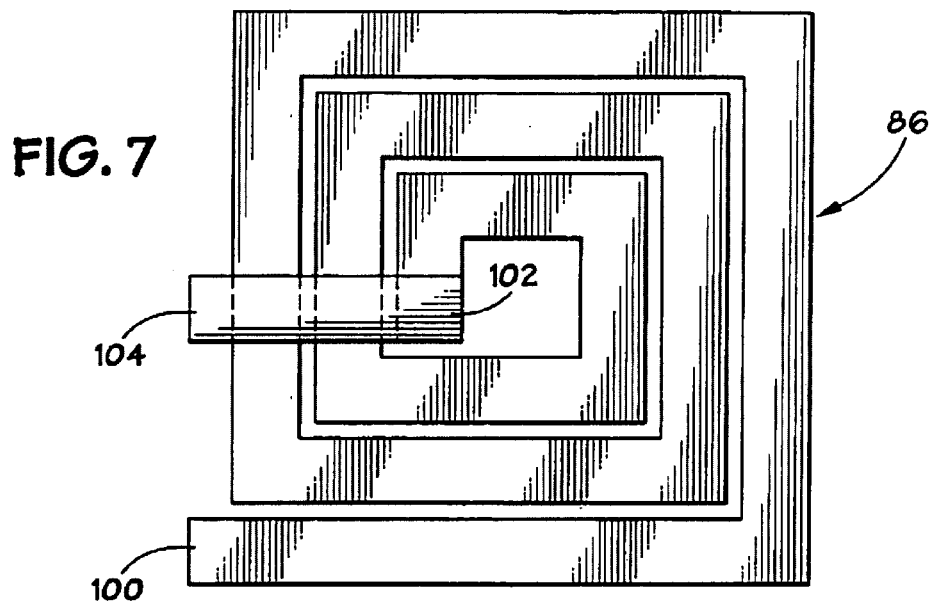
FIG. 7 illustrates an exemplary layout of an integrated inductor for use with the flyback pump of FIG. 5.

Although a flyback pump, such as the flyback pump illustrated in FIG. 5, operates well to generate the programming voltage for the programmable elements, it may be difficult to fabricate a flyback pump on the same integrated circuit as the rest of the test and/or repair circuitry. This difficultly in encountered due to the fact that the flyback pump uses an inductor as an energy storage device to generate the programming voltage. As is well known, inductors are not particularly well suited to fabrication on an integrated circuit, as they require a relatively large amount of chip area to generate even a relatively small amount of inductance. Looking to FIG. 7, inductors, such as the inductor 86, are typically fabricated using a spiral or quasi-spiral pattern, an example of which is illustrated. The inductor 86 may be fabricated by disposing a first conductive trace 100 on a semiconductive or dielectric substrate (not shown). The trace 100 winds around and spirals inwardly to form the main coil of the inductor 86. Once the coil is complete at the center 102 of the inductor 86, a dielectric layer (not shown) is disposed over the first trace 100 and a second trace 104 is disposed over this dielectric layer so that the inductor's second terminal is available. Typically, the second trace 104 is coupled to the center 102 of the inductor 86 by a via that extends through the dielectric layer.

The primary parameters in the layout of the inductor 86 are the geometrical characteristics of the spiral, such as width, spacing between sides, area, and perimeter, as well as other parameters being imposed by the process, such as substrate resistivity, metal conductivity, and metal thickness. The inductor 86 may be made of any suitable conductive material, although metal is typically used, such as copper or an aluminum/copper alloy. In one example, the inductance of the inductor 86 equals 15 nanohenries, with 4 coils, being 3 microns wide, spaced 0.5 microns apart, and being about 750 square microns in area, and about 110 microns in perimeter, where the substrate resistivity equals 19 ohm-centimeter, the metal resistance equals 0.06 ohm per square, and the metal thickness equals 0.5 microns. As an example, using V=L di/dt, an inductance of 15 nanohenries having a current change of 100 milliamperes per 150 picoseconds will yield 10 volts.

Figures 8A, 8B:
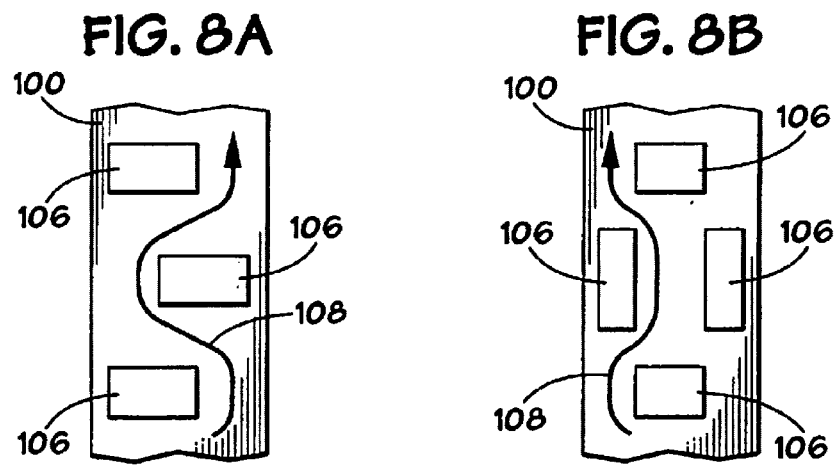
FIG. 8a illustrates an exemplary detailed view of a portion of the inductor of FIG. 7.
FIG. 8b illustrates an alternate exemplary detailed view of a portion of the inductor of FIG. 7.
Figure 8C:
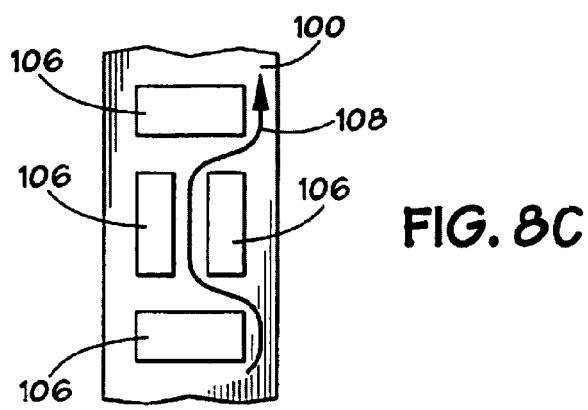
FIG. 8c illustrates another alternate exemplary detailed view of a portion of the inductor of FIG. 7.

To increase the inductance of the inductor 86 without increasing the area that it occupies, the traces 100 and/or 104 may be designed to provide more flux lines. To accomplish this, the traces may be interrupted by a dielectric, as illustrated in FIGS. 8a, 8b, and 8c. As illustrated in these figures, the trace 100 is interrupted by dielectric regions 106, such as air, an oxide, a nitride, etc. Since current cannot flow through these dielectric regions 106, the current paths 108 flow around the dielectric regions 106, thus creating more flux lines and more inductance. The traces and dielectric regions may be formed by any suitable deposition technique.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An integrated circuit comprising:
   a programmable element located on the integrated circuit, the programmable element being coupled to a redundant circuit used to repair the integrated circuit; and
   a source located on the integrated circuit and comprising a flyback pump, the source adapted to be operatively coupled to the programmable element and to develop a programming signal sufficient to program the programmable element to activate the redundant circuit.

2. The integrated circuit, as set forth in claim 1, wherein the integrated circuit comprises a memory device.

3. The integrated circuit, as set forth in claim 2, wherein the redundant circuit comprises a redundant row or column of memory elements.

4. The integrated circuit, as set forth in claim 1, comprising a plurality of programmable elements, each of the plurality of programmable elements being coupled to a respective redundant circuit.

5. The integrated circuit, as set forth in claim 1, wherein the programmable element comprises an antifuse.

6. The integrated circuit, as set forth in claim 1, wherein the source comprises a voltage source adapted to deliver a programming voltage.

7. The integrated circuit, as set forth in claim 6, wherein the programming voltage is higher than a supply voltage of the integrated circuit.

8. The integrated circuit, as set forth in claim 1, wherein the flyback pump comprises:
   an inductance;
   a control circuit coupled to the inductance to control energizing the inductance; and
   an output circuit coupled to the inductance to deliver the programming signal from the inductance to the programmable element.

9. The integrated circuit, as set forth in claim 8, wherein the inductance comprises at least one inductor having a trace having dielectric discontinuities therein.

10. The integrated circuit, as set forth in claim 8, wherein the inductance comprises a single inductor.

11. The integrated circuit, as set forth in claim 8, wherein the inductance comprises a plurality of inductors.

12. The integrated circuit, as set forth in claim 8, wherein the control circuit comprises:
    a transistor coupled to the inductance; and
    a switching device coupled to the transistor to cause the transistor to allow the inductance to be energized.

13. The integrated circuit, as set forth in claim 12, wherein the switching device comprises an oscillator.

14. The integrated circuit, as set forth in claim 8, wherein the output circuit comprises a peak detector.

15. The integrated circuit, as set forth in claim 14, wherein the peak detector comprises a diode.

16. The integrated circuit, as set forth in claim 8, wherein the output circuit comprises a multiplexor adapted to deliver the programming signal to the programmable element.

17. An integrated circuit comprising:
    a test circuit located on the integrated circuit, the test circuit operable to test a target circuit on the integrated circuit to determine whether the target circuit is to be altered;
    a programmable element located on the integrated circuit, the programmable element being coupled to a secondary circuit used to repair the target circuit; and
    a repair circuit comprising a source located on the integrated circuit, the source adapted develop and deliver a programming signal sufficient to program the programmable element to activate the secondary circuit in response to the test circuit indicating that the target circuit is to be altered.

18. The integrated circuit, as set forth in claim 17, wherein the source comprises a voltage source adapted to deliver a programming voltage.

19. The integrated circuit, as set forth in claim 17, wherein the integrated circuit comprises a memory device.

20. The integrated circuit, as set forth in claim 17, wherein the secondary circuit comprises a redundant row or column of memory elements.

21. The integrated circuit, as set forth in claim 17, comprising a plurality of programmable elements, each of the plurality of programmable elements being coupled to a respective secondary circuit.

22. The integrated circuit, as set forth in claim 17, wherein the programmable element comprises one of an antifuse and a fusible component.

23. The integrated circuit, as set forth in claim 18, wherein the source comprises a flyback pump.

24. The integrated circuit, as set forth in claim 18, wherein the programming voltage is higher than a supply voltage of the integrated circuit.

25. The integrated circuit, as set forth in claim 23, wherein the flyback pump comprises:
    an inductance;
    a control circuit coupled to the inductance to control energizing the inductance; and
    an output circuit coupled to the inductance to deliver the programming signal from the inductance to the programmable element.

26. The integrated circuit, as set forth in claim 25, wherein the inductance comprises at least one inductor having a trace having dielectric discontinuities therein.

27. The integrated circuit, as set forth in claim 25, wherein the inductance comprises a single inductor.

28. The integrated circuit, as set forth in claim 25, wherein the inductance comprises a plurality of inductors.

29. The integrated circuit, as set forth in claim 25, wherein the control circuit comprises:
    a transistor coupled to the inductance; and
    a switching device coupled to the transistor to cause the transistor to allow the inductance to be energized.

30. The integrated circuit, as set forth in claim 29, wherein the switching device comprises an oscillator.

31. The integrated circuit, as set forth in claim 25, wherein the output circuit comprises a peak detector.

32. The integrated circuit, as set forth in claim 31, wherein the peak detector comprises a diode.

33. The integrated circuit, as set forth in claim 25, wherein the output circuit comprises a multiplexor adapted to deliver the programming signal to the programmable element.

34. A system comprising:
    a processor;
    a memory device operably coupled to the processor, the memory device comprising:
      a programmable element located on the memory device, the programmable element being coupled to a redundant row or column used to repair the memory device; and
      a source located on the memory device and comprising a flyback pump, the source adapted to develop and deliver a programming signal sufficient to program the programmable element to activate the redundant row or column in response to the processor indicating that a memory location of the memory device is non-functional.

35. The system, as set forth in claim 34, wherein the flyback pump comprises:
   an inductance;
   a control circuit coupled to the inductance to control energizing the inductance; and
   an output circuit coupled to the inductance to deliver the programming signal from the inductance to the programmable element.

36. The system, as set forth in claim 34, wherein the processor comprises a microprocessor.

37. The system, as set forth in claim 34, comprising a plurality of processors operatively coupled to the memory device.

38. The system, as set forth in claim 34, wherein the memory device comprises at least one memory controller operatively coupled to at least one memory chip.

39. The system, as set forth in claim 34, wherein the memory device comprises a plurality of programmable elements, each of the plurality of programmable elements being coupled to a respective redundant row or column.

40. The system, as set forth in claim 34, wherein the programmable element comprises an antifuse.

41. The system, as set forth in claim 34, wherein the source comprises a voltage source adapted to deliver a programming voltage.

42. The system, as set forth in claim 41, wherein the programming voltage is higher than a supply voltage of the memory device.

43. The system, as set forth in claim 35, wherein the inductance comprises at least one inductor having a trace having dielectric discontinuities therein.

44. The system, as set forth in claim 35, wherein the output circuit comprises a multiplexor adapted to deliver the programming signal to the programmable element.

45. The system, as set forth in claim 35, wherein the inductance comprises a single inductor.

46. The system, as set forth in claim 35, wherein the inductance comprises a plurality of inductors.

47. The system, as set forth in claim 35, wherein the control circuit comprises:
   a transistor coupled to the inductance; and
   a switching device coupled to the transistor to cause the inductance to be energized.

48. The system, as set forth in claim 47, wherein the switching device comprises an oscillator.

49. The system, as set forth in claim 35, wherein the output circuit comprises a peak detector.

50. The system, as set forth in claim 49, wherein the peak detector comprises a diode.

51. An integrated circuit testing apparatus comprising:
   an integrated circuit;
   a testing device configured to couple to the integrated circuit and to functionally test at least one target circuit of the integrated circuit, wherein the integrated circuit comprises:
      a programmable element located on the integrated circuit, the programmable element being coupled to redundant circuitry used to repair the integrated circuit; and
   a source located on the integrated circuit and comprising a flyback pump, the source adapted to be operatively coupled to the programmable element and to develop a programming signal sufficient to program the programmable element to activate the redundant circuitry in response to the testing device indicating that the target circuit is at least partially non-functional.

52. The apparatus, as set forth in claim 51, wherein the source comprises a voltage source adapted to deliver a programming voltage.

53. The apparatus, as set forth in claim 52, wherein the programming voltage is higher than a supply voltage of the integrated circuit.

54. The apparatus, as set forth in claim 51, wherein the integrated circuit comprises a memory device.

55. The apparatus, as set forth in claim 54, wherein the redundant circuit comprises a redundant row or column of memory elements.

56. The apparatus, as set forth in claim 51, comprising a plurality of programmable elements, each of the plurality of programmable elements being coupled to a respective redundant circuit.

57. The apparatus, as set forth in claim 51, wherein the programmable element comprises an antifuse.

58. The apparatus, as set forth in claim 51, wherein the flyback pump comprises:
   an inductance;
   a control circuit coupled to the inductance to control energizing the inductance; and
   an output circuit coupled to the inductance to deliver the programming signal from the inductance to the programmable element.

59. The apparatus, as set forth in claim 58, wherein the inductance comprises a single inductor.

60. The apparatus, as set forth in claim 58, wherein the inductance comprises a plurality of inductors.

61. The apparatus, as set forth in claim 58, wherein the control circuit comprises:
   a transistor coupled to the inductance; and
   a switching device coupled to the transistor to cause the inductance to be energized.

62. The apparatus, as set forth in claim 61, wherein the switching device comprises an oscillator.

63. The apparatus, as set forth in claim 58, wherein the output circuit comprises a peak detector.

64. The apparatus, as set forth in claim 63, wherein the peak detector comprises a diode.

65. The apparatus, as set forth in claim 58, wherein the output circuit comprises a multiplexor adapted to deliver the programming signal to the programmable element.

66. The apparatus, as set forth in claim 58, wherein the inductance comprises at least one inductor having a trace having dielectric discontinuities therein.

* * * * *